United States Patent
Kawamura et al.

(10) Patent No.: US 7,141,516 B2
(45) Date of Patent: Nov. 28, 2006

(54) HIGH FREQUENCY PLASMA GENERATOR AND HIGH FREQUENCY PLASMA GENERATING METHOD

(75) Inventors: Keisuke Kawamura, Nagasaki (JP); Akira Yamada, Nagasaki (JP); Hiroshi Mashima, Nagasaki (JP); Yoshiaki Takeuchi, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/519,553

(22) PCT Filed: Oct. 1, 2003

(86) PCT No.: PCT/JP03/12562

§ 371 (c)(1),
(2), (4) Date: Dec. 28, 2004

(87) PCT Pub. No.: WO2004/032213

PCT Pub. Date: Apr. 15, 2004

(65) Prior Publication Data

US 2005/0241768 A1    Nov. 3, 2005

(30) Foreign Application Priority Data

Oct. 1, 2002    (JP) .............................. 2002-288996

(51) Int. Cl.
*C23C 16/00*    (2006.01)

(52) U.S. Cl. ............ 438/795; 118/723 E; 257/E31.001

(58) Field of Classification Search ................ 438/795; 118/723 E
See application file for complete search history.

(56) References Cited

U.S. PATENT DOCUMENTS 5,571,366 A    11/1996  Ishii et al.

(Continued)

FOREIGN PATENT DOCUMENTS

JP    5-291155    11/1993

(Continued)

*Primary Examiner*—W. David Coleman
(74) *Attorney, Agent, or Firm*—Oblon, Spivak, McClelland, Maier & Neustadt, P.C.

(57) ABSTRACT

An object is to provide a high-frequency plasma generating apparatus and process which can further advance uniformity of the thickness of a film on a substrate with a large area in comparison with conventional apparatuses. In a reaction chamber (1), a ground electrode (3) is disposed, and a discharge electrode (2) is disposed opposite to the ground electrode (3). A substrate (4) as a processing object is placed in close contact with the ground electrode (3). A high-frequency voltage is applied to the discharge electrode (2) so as to generate plasma between the ground electrode and the discharge electrode. An RF electric power supply (15) generates a first high-frequency voltage, and outputs the generated voltage on feeding points (9) disposed on a lateral portion of the discharge electrode (2). An RF electric power supply (16) generates a second high-frequency voltage, and outputs the generated voltage on feeding points (9) disposed on another lateral portion of the discharge electrode (2). Here, the second high-frequency voltage has the same frequency as that of the first high-frequency voltage and has a phase which varies with a low-frequency signal, which is modulated by a predetermined modulation signal.

5 Claims, 8 Drawing Sheets

U.S. PATENT DOCUMENTS

| | | |
|---|---|---|
| 6,353,201 B1 | 3/2002 | Yamakoshi et al. |
| 6,380,684 B1 * | 4/2002 | Li et al. ................. 315/111.21 |
| 6,456,010 B1 * | 9/2002 | Yamakoshi et al. ..... 315/111.21 |
| 6,720,268 B1 * | 4/2004 | Laermer et al. ............ 438/700 |
| 6,835,279 B1 * | 12/2004 | Li et al. ................ 156/345.46 |
| 2001/0021422 A1 * | 9/2001 | Yamakoshi et al. ......... 427/569 |
| 2005/0255255 A1 * | 11/2005 | Kawamura et al. ......... 427/569 |

FOREIGN PATENT DOCUMENTS

| | | |
|---|---|---|
| JP | 2001-257098 | 9/2001 |
| JP | 2001-274099 | 10/2001 |
| JP | 2002-327276 | 11/2002 |
| JP | 2003-264152 | 9/2003 |

* cited by examiner

|  | LEFT SIDE |  |  |  |  |  |  | CENTER |  |  |  |  |
|---|---|---|---|---|---|---|---|---|---|---|---|---|
| UPPER SIDE | 5.709533 | 6.1238 | 5.7616 | 5.8216 | 5.8042 | 6.021667 | 6.069 | 5.919 | 5.304 | 5.251 | 5.317333 | 5.4014 |
|  | 5.2436 | 5.7612 | 5.4766 | 5.6826 | 5.9084 | 5.986 | 6.01 | 5.9016 | 5.2014 | 5.2476 | 5.2514 | 5.2992 |
|  | 4.8678 | 5.0574 | 4.9278 | 5.3216 | 5.6714 | 5.7858 | 5.8082 | 5.7754 | 5.0714 | 5.1198 | 5.0696 | 5.0626 |
|  | 5.0597 | 5.2516 | 5.0072 | 4.964 | 5.5476 | 5.7928 | 5.7998 | 5.763 | 4.9834 | 5.0458 | 5.0424 | 5.0152 |
|  | 5.2209 | 5.3514 | 5.0382 | 4.9262 | 5.145933 | 5.763667 | 5.6984 | 5.5646 | 4.8858 | 4.971667 | 5.0006 | 4.9442 |
|  | 5.443 | 5.5092 | 5.0842 | 5.0008 | 5.129667 | 5.525533 | 5.5952 | 5.413 | 4.805 | 4.793667 | 4.822733 | 4.8698 |
|  | 5.2046 | 5.6152 | 5.1278 | 5.0252 | 5.363 | 5.4524 | 5.529 | 5.3274 | 4.7534 | 4.8226 | 4.7914 | 4.807 |
| CENTER | 5.4338 | 5.8868 | 5.4652 | 5.0352 | 5.3388 | 5.391 | 5.4726 | 5.2732 | 4.7096 | 4.7704 | 4.7506 | 4.7738 |
|  | 5.8214 | 6.209 | 5.7538 | 5.2258 | 5.594 | 5.73 | 5.8532 | 5.6024 | 5.05 | 5.0862 | 4.8881 | 5.0256 |
|  | 6.115533 | 6.3162 | 5.8504 | 5.3334 | 5.3844 | 5.851933 | 5.9726 | 5.7156 | 5.1496 | 5.095267 | 5.011967 | 5.1222 |
|  | 6.361333 | 6.4376 | 5.9424 | 5.4462 | 5.675267 | 6.2272 | 6.1284 | 5.8658 | 5.2116 | 5.316733 | 5.3042 | 5.2068 |
|  | 6.1516 | 6.4948 | 6.0046 | 5.5686 | 6.011 | 6.241 | 6.3122 | 6.0532 | 5.3218 | 5.4168 | 5.3874 | 5.3184 |
|  | 5.8882 | 6.2096 | 5.9672 | 5.5598 | 5.997 | 6.2714 | 6.3784 | 6.1278 | 5.4952 | 5.5956 | 5.5386 | 5.46 |
|  | 4.7138 | 5.453 | 5.478 | 5.2224 | 5.4854 | 5.6476 | 5.6828 | 5.655 | 5.3466 | 5.4252 | 5.4544 | 5.4424 |
| LOWER SIDE | 5.3642 | 5.9258 | 5.2854 | 5.1188 | 5.275533 | 5.6364 | 5.5788 | 5.5734 | 5.3634 | 5.3784 | 5.473733 | 5.5244 |

PRIOR ART
FIG. 5

PRIOR ART

HIGH FREQUENCY PLASMA GENERATOR AND HIGH FREQUENCY PLASMA GENERATING METHOD

TECHNICAL FIELD

The present invention relates to high-frequency plasma generating apparatuses and high-frequency plasma generating processes, which can be applied to formation of films of semiconductors useful in solar cells, thin-film transistors, or the like, such as amorphous silicon, microcrystalline silicon, polycrystalline thin-film silicon, and silicon nitride, or which can be applied to etching of semiconductor films.

BACKGROUND ART

Figure 5:
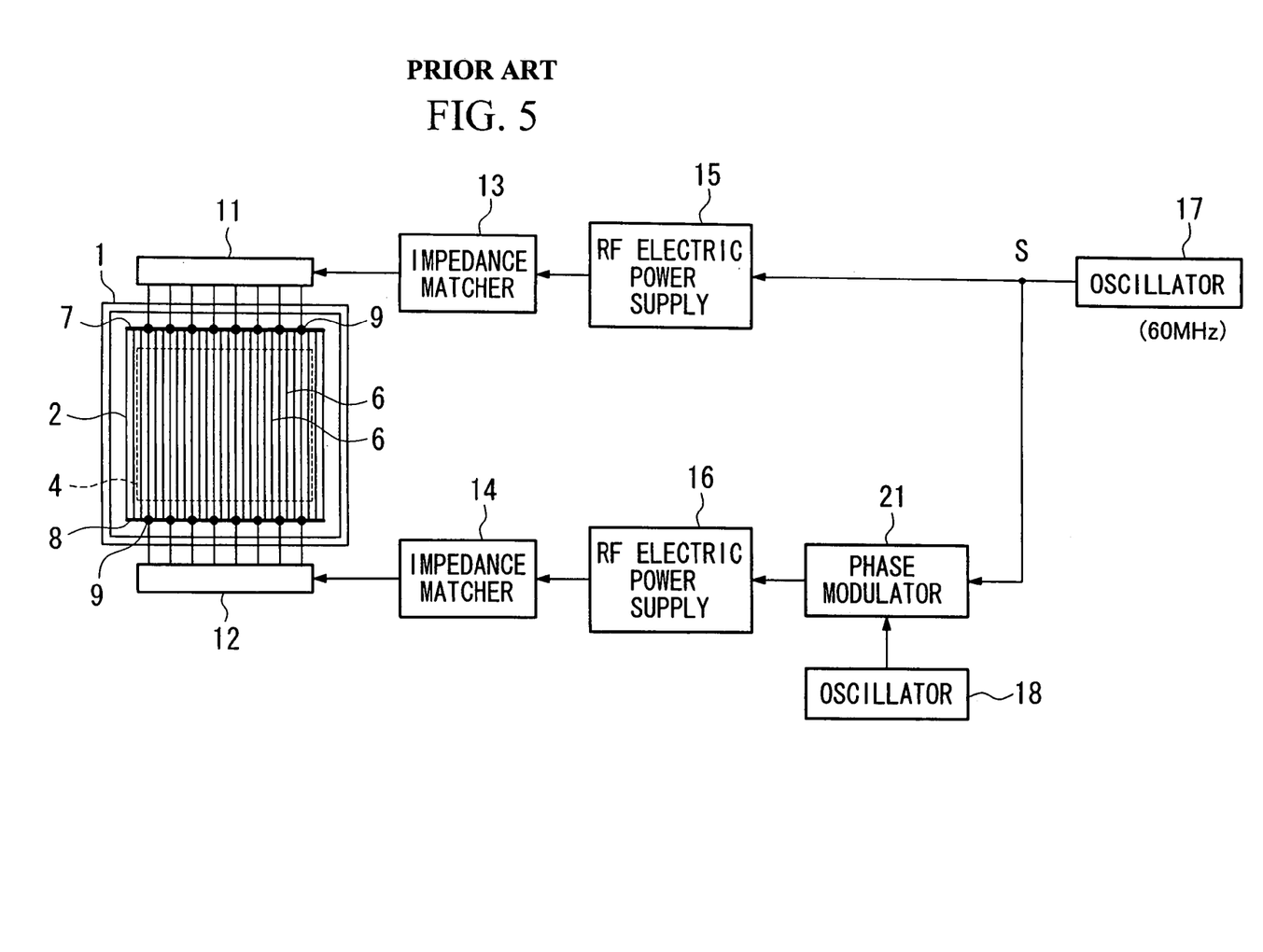
FIG. 5 is a diagram showing an example of a structure of a conventional high-frequency plasma generating apparatus.
Figure 6:
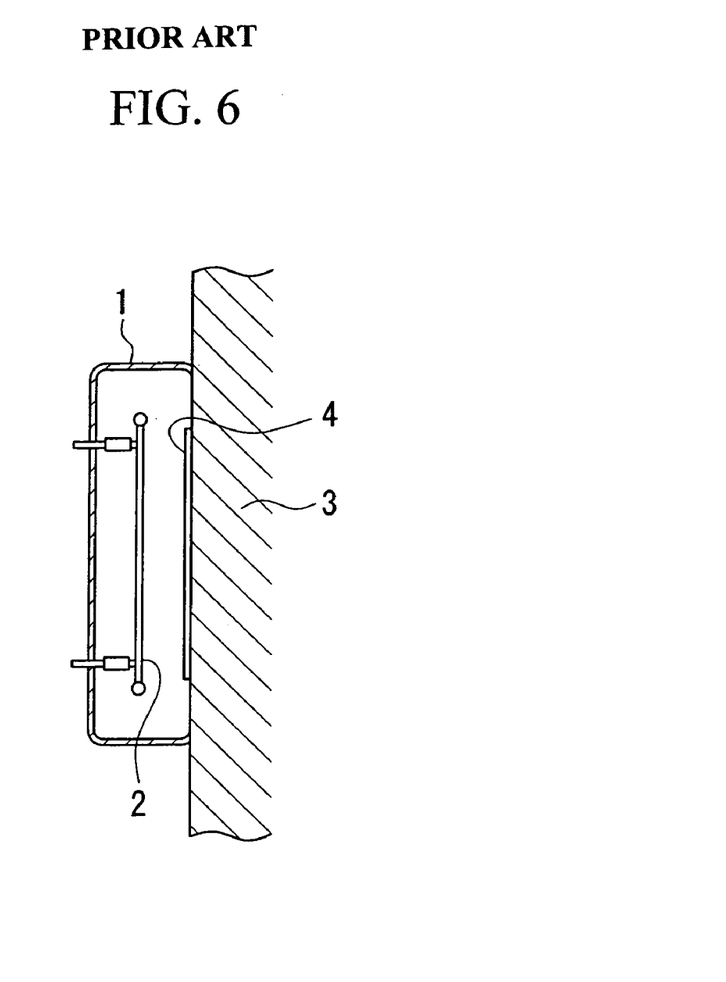
FIG. 6 is a cross-sectional view of a reaction chamber 1 in a conventional high-frequency plasma generating apparatus.

FIG. 5 shows an example of a conventional high-frequency plasma generating apparatus. FIG. 6 is a cross-sectional view showing a reaction chamber 1 of the same apparatus. The high-frequency plasma generating apparatus shown in these figures can be used for production of a thin film of amorphous silicon semiconductor for solar cells.

The inside of the reaction chamber 1 shown in FIG. 5 and FIG. 6 is equipped with a ladder-shaped electrode 2 as a discharge electrode and a ground electrode 3. The reaction chamber 1 is made gastight, to which a gas supply pipe and an exhaust pipe (both of which are not shown in the drawings) are open at appropriate positions respectively. Through the gas supply pipe, which communicates with a gas supply source, a gas for film formation is introduced into the reaction chamber 1. The exhaust pipe communicates with the suction side of a vacuum pump. The reaction chamber 1 can be evacuated to an internal pressure of about $1 \times 10^{-6}$ Torr using this vacuum pump.

The ground electrode 3 and the ladder-shaped electrode 2 are disposed opposite to each other at a predetermined distance (for example, a distance of 20 mm). The ground electrode 3 is equipped with a mechanism for holding a glass substrate 4 as a processing object and has a heater built in so as to heat the glass substrate 4. The ladder-shaped electrode 2 needs to be larger than the glass substrate 4 and is a rectangle with the dimensions 1.25 m by 1.55 m when the glass substrate 4 is a rectangle with the dimensions 1.1 m by 1.4 m.

A gas diffusion port of the gas supply pipe is open desirably behind the ladder-shaped electrode 2 (i.e., on the opposite side to the glass substrate 4). Gas is supplied preferably in parallel from several positions.

As shown in FIG. 5, the ladder-shaped electrode 2 is formed by assembling a plurality of parallel longitudinal electrode rods 6 and a pair of transverse electrode rods 7 and 8 into the form of a lattice, and the ladder-shaped electrode 2 is disposed in parallel with and opposite to the glass substrate 4, which is held by the ground electrode 3. Each of transverse electrode rods 7 and 8 of the ladder-shaped electrode 2 is provided with eight feeding points 9. Feeding points 9 of the transverse electrode rod 7 are individually connected to an electric power divider 11, and feeding points 9 of the transverse electrode rod 8 are individually connected to an electric power divider 12. The electric power dividers 11 and 12 are connected to impedance matchers 13 and 14, respectively, by coaxial cables. The impedance matchers 13 and 14 are connected to RF (high-frequency) electric power supplies 15 and 16, respectively. The RF electric power supply 15 is connected to an output portion of an oscillator 17. The RF electric power supply 16 is connected via a phase modulator 21 to the output portion of the oscillator 17. The phase modulator 21 is a circuit which modulates the phase of an output signal S from the oscillator 17 according to output from a sine wave (or triangle wave) oscillator 18, and outputs the modulated signal to the RF electric power supply 16. Here, the output amplitude of the oscillator 18 is constant, and therefore, the phase shift $\Delta\theta$ of modulation by the phase modulator 21 is constant.

With the above structure, the glass substrate 4 on which an a-Si thin film is to be formed is placed on the ground electrode 3 which is set at a temperature of 200° C., for example, then $SiH_4$ gas is introduced at a flow rate of 2 slm, for example, from the gas supply pipe, and the exhaust rate of the vacuum pump system which is connected to the vacuum exhaust pipe is regulated, so as to adjust the pressure inside the reaction chamber 1 to, for example, 40 Pa (300 mTorr). Then, a high-frequency signal of 60 MHz generated by the oscillator 17 is amplified using the RF electric power supplies 15 and 16, and is applied to the transverse electrode rods 7 and 8 of the ladder-shaped electrode 2 through the impedance matchers 13 and 14 and the electric power dividers 11 and 12. This operation generates plasma between the glass substrate 4 and the ladder-shaped electrode 2. At this point, the impedance matchers 13 and 14 are adjusted so that the high-frequency electric power can be efficiently supplied to the plasma generating part. In the plasma, $SiH_4$ is decomposed, and an a-Si film is formed on the surface of the glass substrate 4. An a-Si film with a required thickness can be formed by continuing this film forming operation in this condition for, for example, about 5 to 10 minutes.

However, there is a drawback to the above-described conventional high-frequency plasma generating apparatus in that it is difficult to uniformly form a large area film. This is because a standing wave is generated mainly due to a reflected wave which occurs at an end of an electrode or the like, since the wavelength of the high-frequency wave is about on the same order as the sizes of the electrodes 2 and 3. For example, the wavelength for 60 MHz on the ladder-shaped electrode would be about 3 m. Although the wavelength for 60 MHz in a vacuum is 5 m, the wavelength in plasma is shortened due to increase in capacitance. This wavelength of 3 m gives a ¼ wavelength of about 0.75 m as opposed to the electrode length of 1.25 m, creating maximum and minimum voltage points on the electrode. Therefore, plasma becomes nonuniform following the voltage distribution on the electrode, causing as a result a problem in that a film is formed nonuniformly.

In order to solve such a problem, there are apparatuses as in Japanese Patent Application No. 2001-133830, and there are apparatuses as disclosed in Japanese Patent Application, First Publication (Kokai), No. 2001-274099.

Since an apparatus according to Japanese Patent Application No. 2001-133830 employs a method of high-speed switching between a single-frequency plasma and a double-frequency plasma, plasma changes discontinuously, and a strong plasma is formed in the vicinity of feeding points. Accordingly, there is a limit to obtaining uniformity in the distribution of film thickness, and when a strong plasma exists, the possibility arises that generation of nanoclusters degrades the quality of the film.

On the other hand, an apparatus as disclosed in Japanese Patent Application, First Publication (Kokai), No. 2001-274099 is an apparatus as shown in FIG. 5 with which the phase of the high-frequency applied to the transverse electrode rods 7 and 8 is periodically varied. That is, the phase of output from the RF electric power supply 16 is periodically varied with respect to the phase of output from the RF electric power supply 15 (see FIG. 4 and paragraphs 0091 to 0096 of that publication).

DISCLOSURE OF INVENTION

Figure 7A:
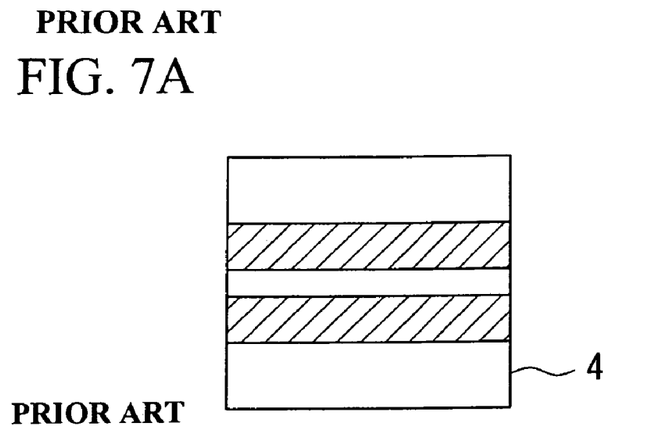
FIG. 7 shows diagrams to illustrate problems with a conventional high-frequency plasma generating apparatus.
Figure 7B:
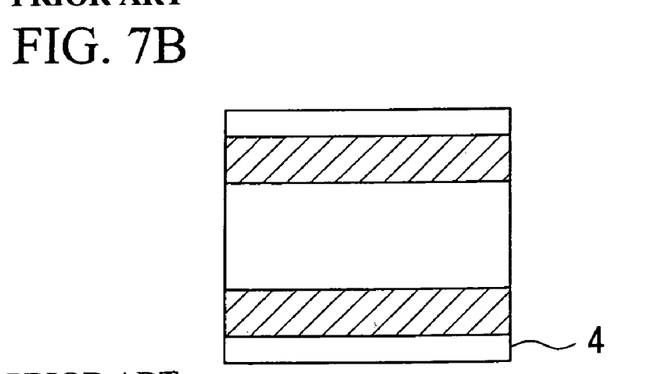
Figure 7C:
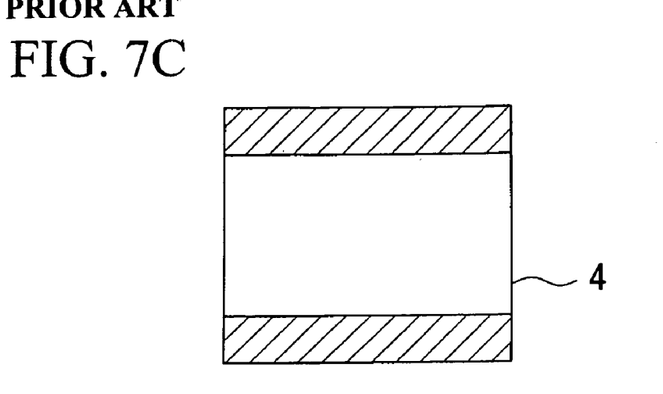
Figure 8A:
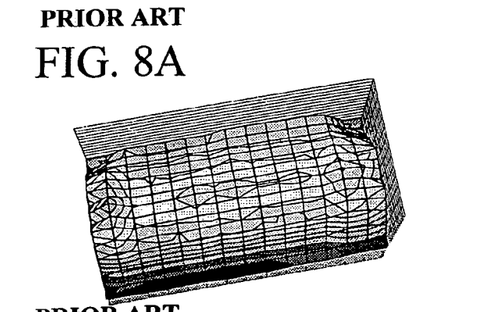
FIG. 8 shows diagrams to illustrate problems with a conventional high-frequency plasma generating apparatus.
Figure 8B:
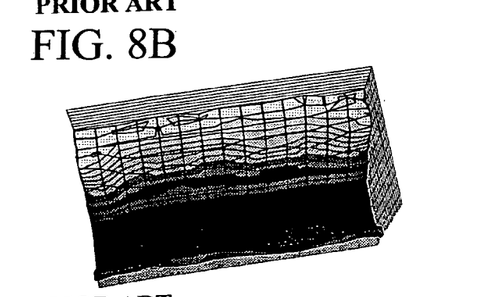
Figure 8C:
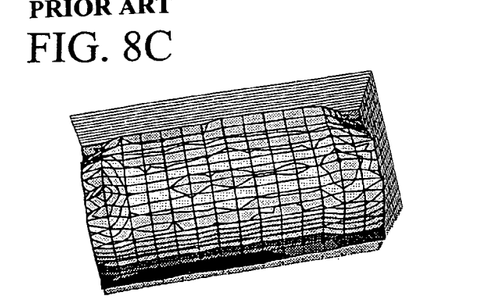
Figure 8D:
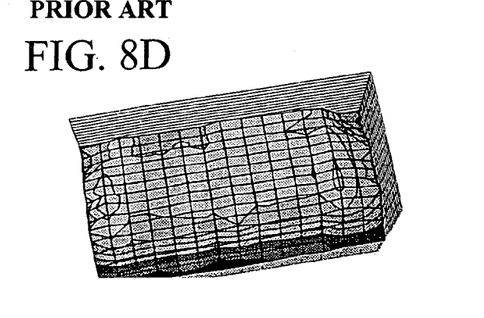
Figure 8E:
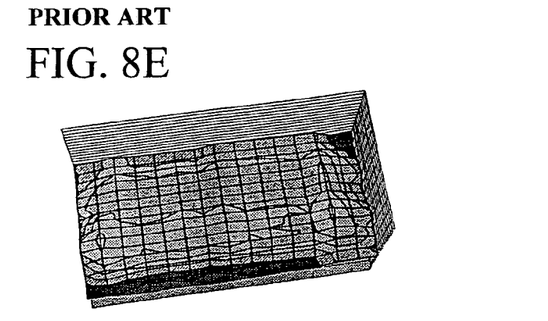
Figure 8F:
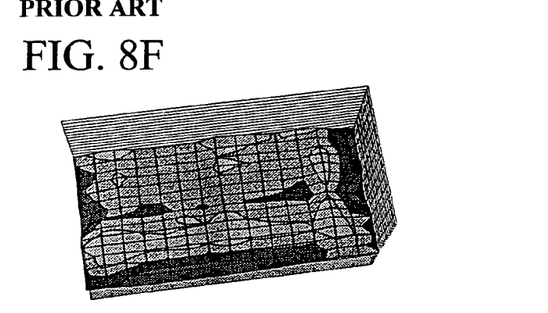
Figure 8G:
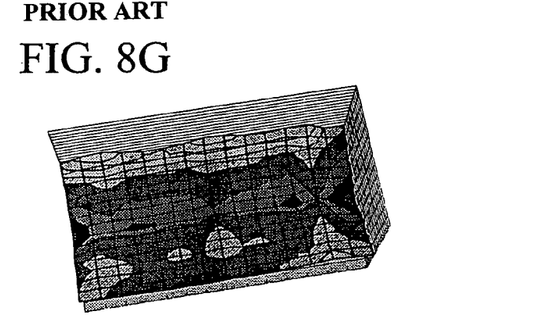

The apparatuses disclosed in Japanese Patent Application, First Publication (Kokai), No. 2001-274099 are to reduce nonuniformity of the thickness of a film formed by an apparatus as shown in FIG. 5. However, nonuniformity as explained in the following still remains in the longitudinal direction (i.e., in the direction along the electrode rod 6). That is, when the phase difference $\Delta\theta$ in output of the RF electric power supply 16 from output of the RF electric power supply 15 is periodically (10 KHz) varied in the range of $-90°$ to $+90°$, the thickness of part of the film becomes large on the central part of the glass substrate 4 as shown in FIG. 7A. When the phase difference $\Delta\theta$ is periodically varied in the range of $-135°$ to $+135°$, the thickness of part of the film becomes large as shown in FIG. 7B, slightly outside the area shown in FIG. 7A. When the phase difference $\Delta\theta$ is periodically varied in the range of $-180°$ to $+180°$, the thickness of part of the film becomes large on the edges of the glass substrate 4 as shown in FIG. 7C. The actual distribution of the thickness of a formed film is as shown in FIG. 8, in which the state of the distribution is seen. FIG. 7A corresponds to FIG. 8E, FIG. 7B corresponds to FIG. 8F, and FIG. 7C corresponds to FIG. 8G. When the phase modulation angle was fixed as above, it was difficult to uniformly distribute the thickness of a film. Furthermore, in the distribution of the thickness of a film formed with a fixed phase which is shifted by $+45°$ without phase modulation, there is a portion having a large film thickness extending up to the upper part of the substrate as shown in FIG. 8B. This distribution of film thickness does not correspond to that in FIG. 8D, which shows a result with the same phase shift of $45°$ and with phase modulation. Thus, it has become clear that a portion where a high voltage is applied does not always correspond with a portion which has a large film thickness with phase modulation.

The present invention was conceived under the above circumstances, and an object of the present invention is to provide a high-frequency plasma generating apparatus and a high-frequency plasma generating process which can further advance uniformity of the thickness of a film on a substrate with a large area in comparison with the above-described conventional apparatuses.

The present invention was achieved in order to solve the above problems, and according to the present invention, in a high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode, the high-frequency plasma generating apparatus comprises:

a first high-frequency generator which generates a first high-frequency voltage, a first electric power feeder which applies the first high-frequency voltage to a feeding point disposed on a lateral portion of the discharge electrode, a second high-frequency generator which generates a second high-frequency voltage, and a second electric power feeder which applies the second high-frequency voltage to a feeding point disposed on another lateral portion of the discharge electrode, wherein the second high-frequency voltage has the same frequency as that of the first high-frequency voltage and has a phase which varies with a low-frequency signal, which is modulated by a predetermined modulation signal.

Alternatively, according to the present invention, in a high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode, the high-frequency plasma generating apparatus comprises:

a high-frequency oscillator which generates a high-frequency signal, a first high-frequency generator which amplifies the high-frequency signal from the high-frequency oscillator to yield a first high-frequency voltage, and which outputs the first high-frequency voltage, a first electric power feeder which applies the first high-frequency voltage to a feeding point disposed on a lateral portion of the discharge electrode, a low-frequency oscillator which generates a low-frequency signal which is modulated by a predetermined modulation signal, a phase modulator which modulates the phase of the high-frequency signal from the high-frequency oscillator with the low-frequency signal, a second high-frequency generator which amplifies the high-frequency signal modulated by the phase modulator to yield a second high-frequency voltage, and which outputs the second high-frequency voltage, and a second electric power feeder which applies the second high-frequency voltage to a feeding point disposed on another lateral portion of the discharge electrode.

Alternatively, according to the present invention, in either of the above high-frequency plasma generating apparatuses, the discharge electrode is a ladder-shaped electrode formed by disposing a plurality of longitudinal electrode rods between two transverse electrode rods, and the feeding point is disposed on the transverse electrode rods.

In addition, according to the present invention, in a high-frequency plasma generating process in which a substrate as a processing object is placed in close contact with a ground electrode, which is disposed in a reaction chamber in which a discharge electrode is disposed opposite to the ground electrode, and a high-frequency voltage is applied to the discharge electrode so as to generate plasma between the ground electrode and the discharge electrode, the high-frequency plasma generating process comprises:

applying a first high-frequency voltage to a feeding point disposed on a lateral portion of the discharge electrode, and applying a second high-frequency voltage to a feeding point disposed on another lateral portion of the discharge electrode, the second high-frequency voltage having the same frequency as that of the first high-frequency voltage and having a phase which varies with a low-frequency signal, which is modulated by a predetermined modulation signal.

In addition, according to the present invention, in a process for cleaning a high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode, the process for cleaning the high-frequency plasma generating apparatus comprises:

introducing a halogen compound such as $NF_3$, $CF_4$, $CCl_4$, $SF_6$ into the reaction chamber, applying a first high-frequency voltage to a feeding point disposed on a lateral portion of the discharge electrode, and applying a second high-frequency voltage to a feeding point disposed on another lateral portion of the discharge electrode, the second high-frequency voltage having the same frequency as that of the first high-frequency voltage and having a phase which varies with a low-frequency signal, which is modulated by a predetermined modulation signal.

By the high-frequency plasma generating apparatus and in the high-frequency plasma generating process according to the present invention, a first high-frequency voltage is applied to a feeding point disposed on a lateral portion of the discharge electrode, and a second high-frequency voltage is applied to a feeding point disposed on another lateral portion of the discharge electrode, the second high-frequency voltage having the same frequency as that of the first high-frequency voltage and having a phase which varies with a low-frequency signal, which is modulated by a predetermined modulation signal. Therefore, the high-frequency plasma generating apparatus and high-frequency plasma generating process according to the present invention are more effective in achieving uniformity in the thickness of a film formed on a substrate having a large area than conventional apparatuses.

Accordingly, an apparatus according the present invention when used to produce a thin film of amorphous silicon semiconductor for an electric cell, for example, contributes greatly to improvement in the performance of the electric cell since the thickness of the film can be made uniform. In addition, cutting performance of laser in a laser etching step in a process can be greatly improved, which also contributes to improvement in the performance of the electric cell.

In addition, since the film thickness can be made uniform according to the present invention, a pattern such as interference fringes does not appear, and therefore the present invention is advantageous in improving the appearance of products.

Furthermore, the process for cleaning a high-frequency plasma generating apparatus according to the present invention is effective in allowing the apparatus to self-clean without causing overetching. Moreover, since uniformity in cleaning is improved, the process has effects of shortening time for cleaning and contributing to minimizing influence on the distribution of the formed film before and after cleaning.

BEST MODE FOR CARRYING OUT THE INVENTION

Figure 1:
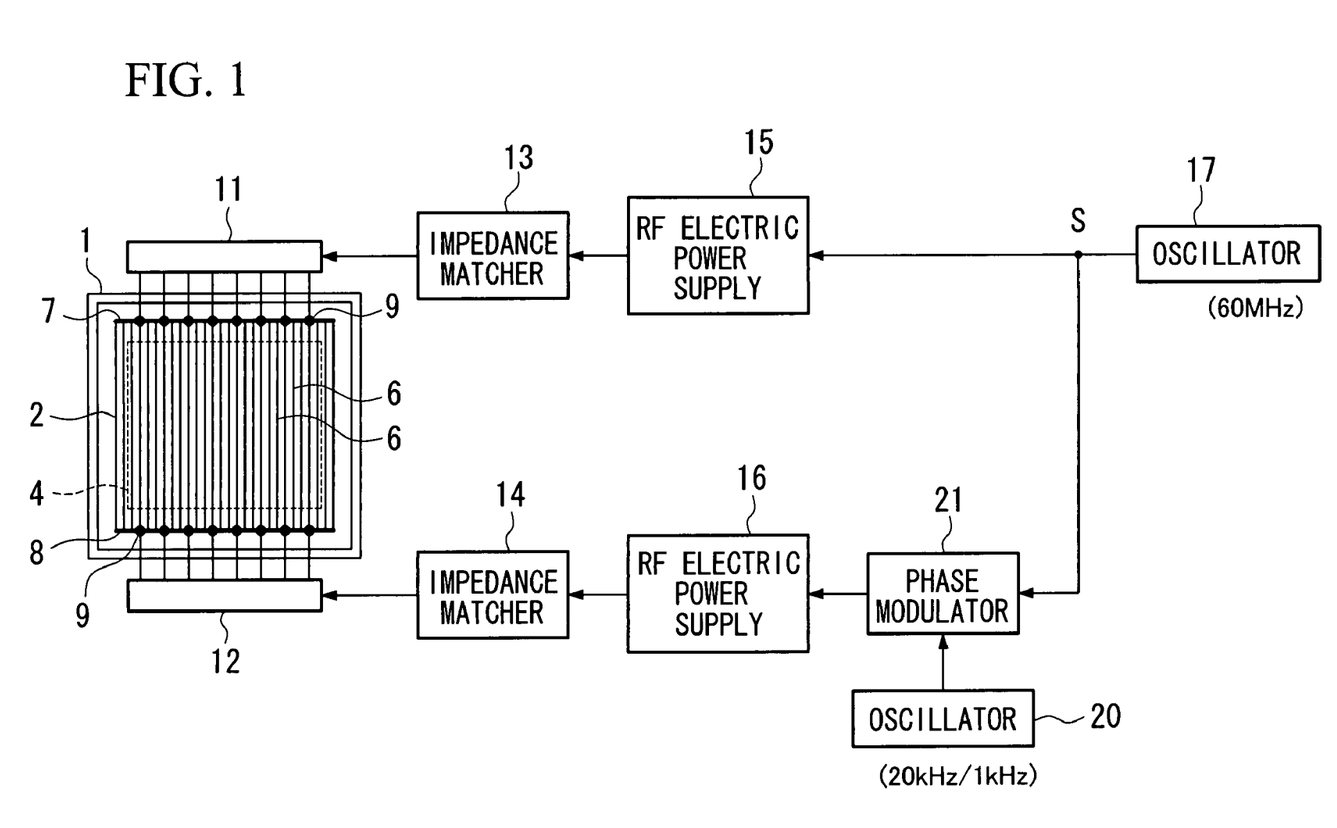
FIG. 1 is a block diagram showing a structure of a high-frequency plasma generating apparatus according to a first embodiment of the present invention.

An embodiment of the present invention will be described below by referring to the drawings. FIG. 1 is a block diagram showing a structure of a high-frequency plasma generating apparatus according to this embodiment. The same reference numerals as those in FIG. 5 are assigned in FIG. 1 to the parts which are structurally the same as those in FIG. 5, and explanations of such parts are omitted.

Figure 2:
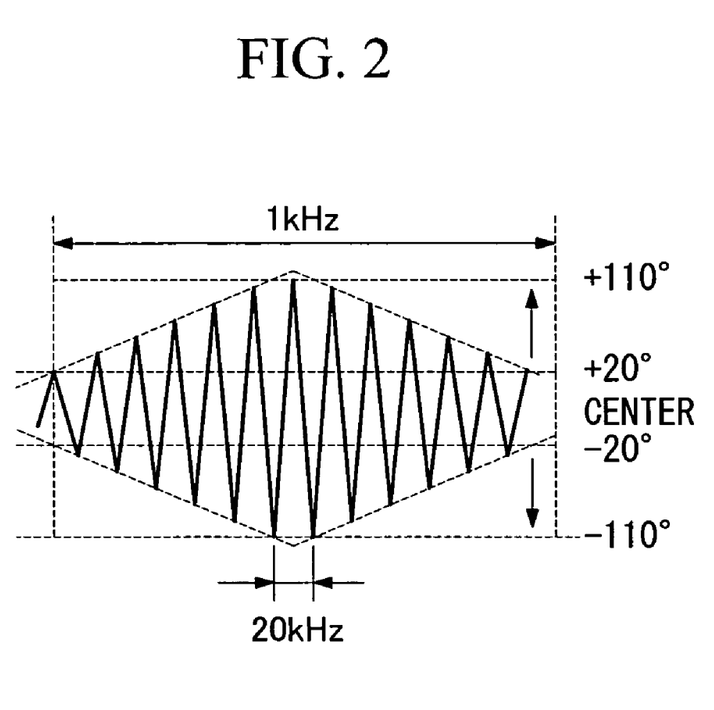
FIG. 2 is a diagram showing a signal for phase modulation generated by an oscillator 20 in the same embodiment.

The high-frequency plasma generating apparatus according to this embodiment differs from the apparatus as shown in FIG. 5 in that an oscillator 20 and a phase modulator 21 deal with not only simple triangle waves or the like, but also arbitrarily modulated waveforms. The oscillator 20 is a circuit which generates a signal in a triangle wave with a frequency of 20 KHz as shown in FIG. 2, the signal having been subjected to amplitude modulation using a triangle wave with a frequency of 1 KHz. The phase modulator 21 is a circuit which modulates the phase of an output signal S (60 MHz) from an oscillator 17 using the output from the oscillator 20, and outputs the modulated signal to an RF electric power supply 16. That is, as shown in FIG. 2, the phase modulator 21 changes the phase of the signal S by +110° and outputs the changed signal to the RF electric power supply 16 when the peak value of output from the oscillator 20 is a positive maximum value, and the phase modulator 21 changes the phase of the signal S by –110° and outputs the changed signal to the RF electric power supply 16 when the peak value of output from the oscillator 20 is a negative maximum value. The phase modulator 21 changes the phase of the signal S by +20° and outputs the changed signal to the RF electric power supply 16 when the peak value of output from the oscillator 20 is a positive minimum value, and the phase modulator 21 changes the phase of the signal S by –20° and outputs the changed signal to the RF electric power supply 16 when the peak value of output from the oscillator 20 is a negative minimum value.

The high-frequency signal S of 60 MHz with a phase modulated by the phase modulator 21 as described above is amplified by the RF electric power supply 16, and is output on a transverse electrode rod 8 of the ladder-shaped electrode 2 via an impedance matcher 14 and an electric power divider 12. Such a structure allows the position where the plasma turns back to fluctuate instead of being fixed since the phase modulation angle of the high-frequency signal applied to the transverse electrode rod 8 varies over time. Accordingly, concentration of plasma can be avoided, and uniform plasma can be realized.

Figure 3:
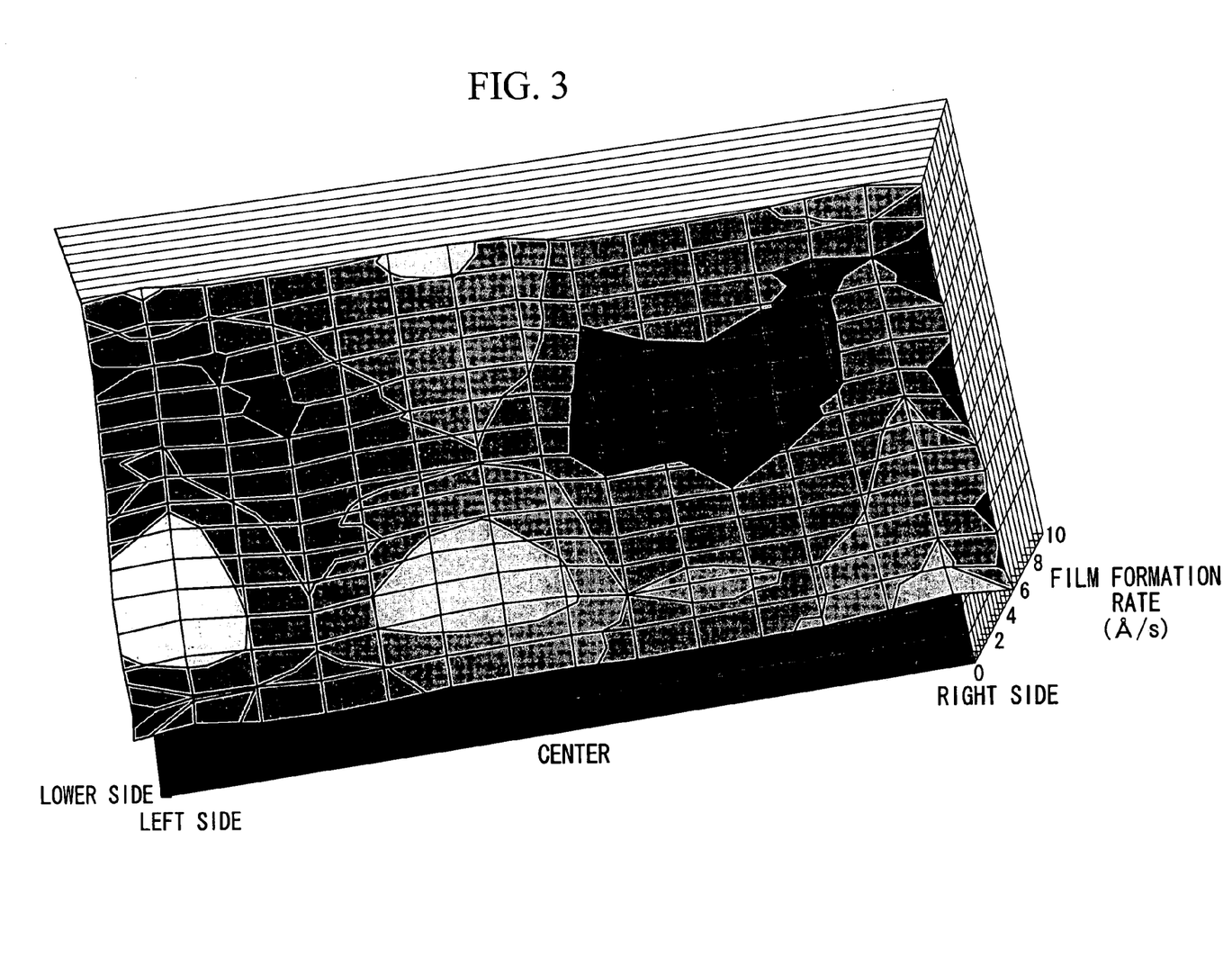
FIG. 3 is a diagram to be used in explaining effects of the same embodiment.
Figure 4:
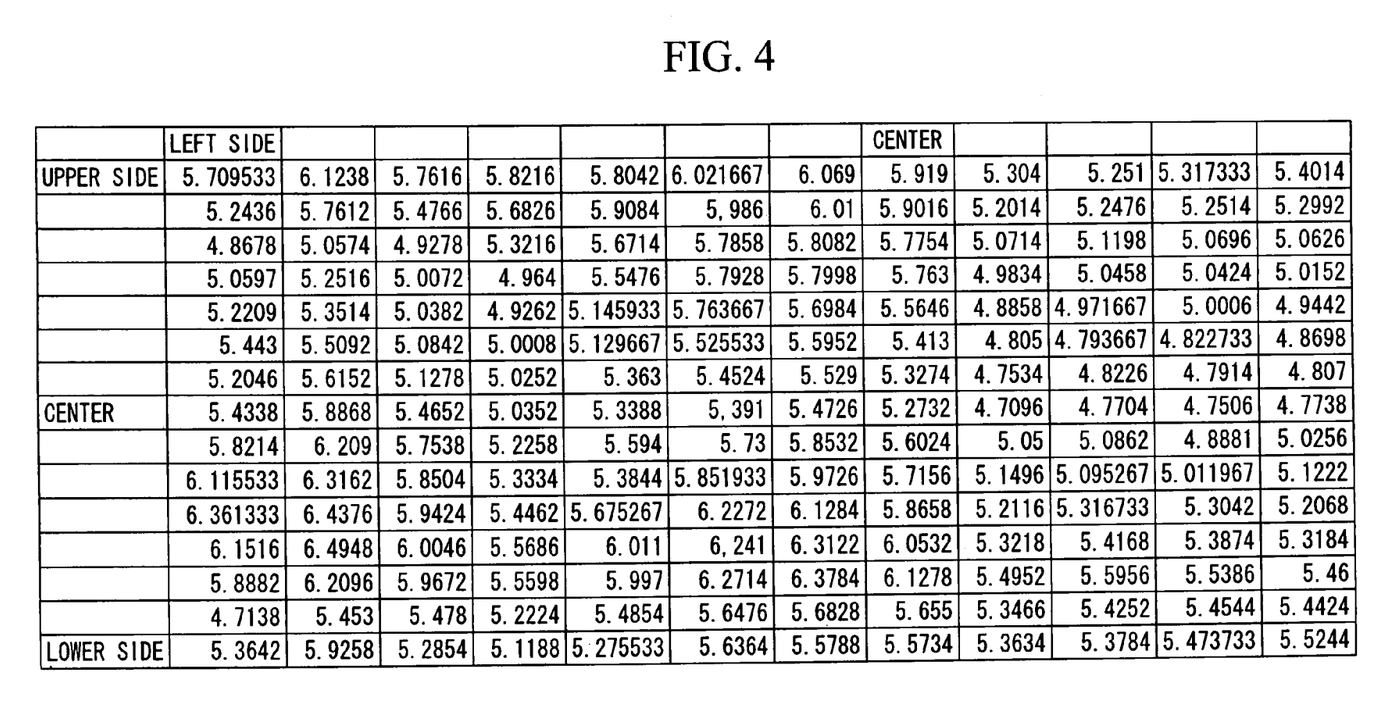
FIG. 4 is a diagram showing results of measuring the thickness of the thin film of semiconductor shown in FIG. 3.

FIG. 3 shows a distribution of the thickness of a thin film of amorphous silicon semiconductor formed by a high frequency plasma generating apparatus according to the above embodiment. This figure can be regarded as showing a distribution of the film thickness obtained by continuously changing conditions through FIGS. 8A, 8B, 8C, 8D, 8E, and 8F so as to make the distribution of the film thickness uniform in a time-averaged sense. As is clear from this figure, uniformity of a thin film is greatly improved by carrying out phase modulation according to the process as shown in FIG. 2 in comparison with that of conventional processes. FIG. 4 shows results of measuring the thickness of the thin film of semiconductor shown in FIG. 3.

Although both waveforms of oscillation and modulation by the oscillator 20 are triangle waves according to the above embodiment, they are not limited to triangle waves, and they may be sine waves or square waves. The frequency of the signal (20 KHz) and the frequency of the modulation waveform (1 KHz) of the oscillator 20 are only for examples, and are not limited to these frequencies.

Incidentally, in a high-frequency plasma generating apparatus, a silicon film may be deposited on the inside of a reaction chamber 1, and some of the silicon film may fall or produce silicon powder in the gas phase, as formation of amorphous silicon films or the like is repeated continuously. If such silicon powder adheres to a glass substrate 4 during formation of a film, a defective product would be produced.

Therefore, self-cleaning as described below is carried out in this embodiment. That is, operation of film formation by the high-frequency plasma generating apparatus is stopped temporarily, NF$_3$ (nitrogen trifluoride) to work as an etching gas having strong reactivity is introduced into the reaction chamber 1, and a high-frequency voltage (with one side having undergone phase modulation) of 60 MHz, which is the same as that used for the above-described film formation, is applied to each of the transverse electrode rods 7 and 8 of the ladder-shaped electrode 2. By doing this, NF$_3$ becomes plasma and is decomposed, and the inside of the reaction chamber 1 is etched by F (fluorine) radicals produced by the decomposition, whereby the silicon film or the silicon powder is gasified and removed as SiF$_4$ (silicon fluoride) as in the following formula.

As opposed to a conventional apparatus which has a problem in that overetching (corrosion of metal part by F radical) occurs in some places in the above case due to nonuniform plasma, the above embodiment allows self-cleaning without overetching since plasma can be generated uniformly.

The invention claimed is:

1. A high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode, the high-frequency plasma generating apparatus comprising:
a first high-frequency generator which generates a first high-frequency voltage,
a first electric power feeder which applies the first high-frequency voltage to a feeding point disposed on a lateral portion of the discharge electrode,
a second high-frequency generator which generates a second high-frequency voltage, and
a second electric power feeder which applies the second high-frequency voltage to a feeding point disposed on another lateral portion of the discharge electrode,
wherein the second high-frequency voltage has the same frequency as that of the first high-frequency voltage and has a phase which varies with a low-frequency signal, which is modulated by a predetermined modulation signal.

2. A high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode, the high-frequency plasma generating apparatus comprising:
a high-frequency oscillator which generates a high-frequency signal,
a first high-frequency generator which amplifies the high-frequency signal from the high-frequency oscillator to yield a first high-frequency voltage, and which outputs the first high-frequency voltage,
a first electric power feeder which applies the first high-frequency voltage to a feeding point disposed on a lateral portion of the discharge electrode,
a low-frequency oscillator which generates a low-frequency signal which is modulated by a predetermined modulation signal,
a phase modulator which modulates the phase of the high-frequency signal from the high-frequency oscillator with the low-frequency signal,
a second high-frequency generator which amplifies the high-frequency signal modulated by the phase modulator to yield a second high-frequency voltage, and which outputs the second high-frequency voltage, and
a second electric power feeder which applies the second high-frequency voltage to a feeding point disposed on another lateral portion of the discharge electrode.

3. A high-frequency plasma generating apparatus according to claim 1 or 2, wherein the discharge electrode is a ladder-shaped electrode formed by disposing a plurality of longitudinal electrode rods between two transverse electrode rods, and the feeding point is disposed on the transverse electrode rods.

4. A high-frequency plasma generating process in which a substrate as a processing object is placed in close contact with a ground electrode, which is disposed in a reaction chamber in which a discharge electrode is disposed opposite to the ground electrode, and a high-frequency voltage is applied to the discharge electrode so as to generate plasma between the ground electrode and the discharge electrode, the high-frequency plasma generating process comprising:
applying a first high-frequency voltage to a feeding point disposed on a lateral portion of the discharge electrode, and
applying a second high-frequency voltage to a feeding point disposed on another lateral portion of the discharge electrode, the second high-frequency voltage having the same frequency as that of the first high-frequency voltage and having a phase which varies with a low-frequency signal, which is modulated by a predetermined modulation signal.

5. A process for cleaning a high-frequency plasma generating apparatus having a reaction chamber in which a ground electrode is disposed and a discharge electrode is disposed opposite to the ground electrode, so that a substrate as a processing object will be placed in close contact with the ground electrode, and a high-frequency voltage will be applied to the discharge electrode so as to generate plasma between the ground electrode and the discharge electrode,
the process for cleaning the high-frequency plasma generating apparatus comprising:
introducing a halogen compound such as $NF_3$, $CF_4$, $CCL_4$, $SF_6$ into the reaction chamber,
applying a first high-frequency voltage to a feeding point disposed on a lateral portion of the discharge electrode, and
applying a second high-frequency voltage to a feeding point disposed on another lateral portion of the discharge electrode, the second high-frequency voltage having the same frequency as that of the first high-frequency voltage and having a phase which varies with a low-frequency signal, which is modulated by a predetermined modulation signal.

* * * * *